United States Patent [19]
Lee et al.

[11] Patent Number: 5,933,326
[45] Date of Patent: Aug. 3, 1999

[54] CLIPPING DEVICE FOR HEAT SINK

[75] Inventors: Shun-Jung Lee, Pan-Chiao; Richard Lee, Taipei, both of Taiwan

[73] Assignee: Hon Hai Precision Ind. Co., Ltd., Taipei Hsien, Taiwan

[21] Appl. No.: 09/114,438

[22] Filed: Jul. 13, 1998

[30] Foreign Application Priority Data

Jul. 12, 1997 [TW] Taiwan .................................. 86211753

[51] Int. Cl.⁶ .................................................. H05K 7/20
[52] U.S. Cl. .......................... 361/704; 361/707; 361/709; 361/717; 361/718; 257/706; 257/707; 257/713; 257/726; 174/16.3; 165/80.3; 24/457; 248/505; 248/510
[58] Field of Search ........................... 361/704, 706–707, 361/709–711, 717, 718, 722, 818; 165/80.3, 80.4, 185; 174/16.3; 24/457, 458; 439/487; 248/505, 510; 257/706–727

[56] References Cited

U.S. PATENT DOCUMENTS 5,617,292   4/1997  Steiner ..................................... 361/704

*Primary Examiner*—Leo P. Picard
*Assistant Examiner*—Michael Datskovsky

[57] ABSTRACT

A clipping device for attaching a heat sink to an electrical device comprises an elongate biasing strip and a pivotal grasp pivotally connected to an end of the biasing strip. Interconnecting retaining device between the biasing strip and the pivotal grasp to pivotally attach the pivotal grasp to the biasing strip, includes a slot defined in the latch tab and a head portion formed on the biasing strip. The head portion includes a tongue portion and a neck portion. The tongue portion includes at least a wing extending transversely therefrom, wherein the wing is deformed to offset from a horizontal side of the slot after insertion thereof, thereby securely retaining the head portion within the slot.

1 Claim, 3 Drawing Sheets

CLIPPING DEVICE FOR HEAT SINK

FIELD OF THE INVENTION

The present invention relates to a clipping device, and more particularly to a clipping device for a heat sink, having an elongate biasing strip adapted for attaching a heat sink onto an upper surface of a heat source such as a CPU.

DESCRIPTION OF THE PRIOR ART

In order to ensure the functional operation of a computer having a powerful CPU, the heat generated from the CPU has to be efficiently removed therefrom since the CPU may malfunction if excessive heat is not dissipated.

In light of this, a heat sink device has been introduced to dissipate the heat generated from the CPU. A typical heat sink device includes a heat sink and an elongate clip adapted for attaching the heat sink to an upper surface of the CPU for dissipating heat therefrom. U.S. Pat. Nos. 4,745,456, 5,019,940, and 5,594,624, and Taiwan Utility Patent Nos. 83217100-1, 83217100-2, 84207163, 84212747, 85200861, and 85206293 disclose such clips.

However, existing clips have the following disadvantages.

The existing clip has a complex shape with a multiple-piece configuration as seen in U.S. Pat. Nos. 4,745,456 and 5,019,940, and Taiwan Utility Patent Nos. 83217100-2, 84212747 and 85200861.

Alternatively, the clip is formed as a single unit which is inconvenient to use. An external tool is required to facilitate installation or disassembly of the clip from a supporting socket on which the CPU is mounted. U.S. Pat. No. 5,594,163, and Taiwan Utility Patent Nos. 84207163 and 85206293 disclose chips with such a configuration.

U.S. Pat. No. 5,617,292 discloses a two-piece clip for heat dissipating assemblies. However, tapered prongs interferentially fit with side of a slot which results in a laborious assembly procedure. Furthermore, when a second set of flap and an extended accommodation are included, the manufacturing process becomes further complicated.

SUMMARY OF THE INVENTION

An objective of the present invention is to provide a clipping device for a heat sink having an elongate biasing strip adapted for facilitating the attachment of a heat sink onto an upper surface of a heat source such as a CPU.

Another objective of the present invention is to provide a clipping device for a heat sink having an elongate biasing strip having a simplified configuration thereby simplifying the manufacturing process thereof.

In order to achieve the objectives set forth, a clipping device for a heat sink in accordance with the present invention generally comprises an elongate biasing strip made from a suitable resilient material. The elongate biasing strip forms an anchoring section extending downward from one end thereof having an engaging portion for interlocking with a first retaining portion of a socket for a CPU, and a connecting section at the other end. A pivotal grasp arranged perpendicular to the biasing strip forms a thumb portion for receiving a manipulating force thereon and a latch tab for interlocking with a second retaining portion of the socket. Interconnecting retaining means between the biasing strip and the pivotal grasp to pivotally attach the pivotal grasp to the biasing strip, includes a slot defined in the latch tab and a head portion formed on the connecting section of the biasing strip. The head portion includes a tongue portion and a neck portion adjacent thereto for abutting a portion of the latch tab adjacent to the slot. The tongue portion includes at least a wing extending transversely therefrom, wherein the wing is deformed to offset from a horizontal side of the slot after insertion thereof, thereby securely retaining the head portion within the slot.

These and additional objects, features, and advantages of the present invention will become apparent after reading the following detailed description of the preferred embodiment of the invention taken in conjunction with the appended drawings.

DETAILED DESCRIPTION OF PREFERRED EMBODIMENT

Figure 1:
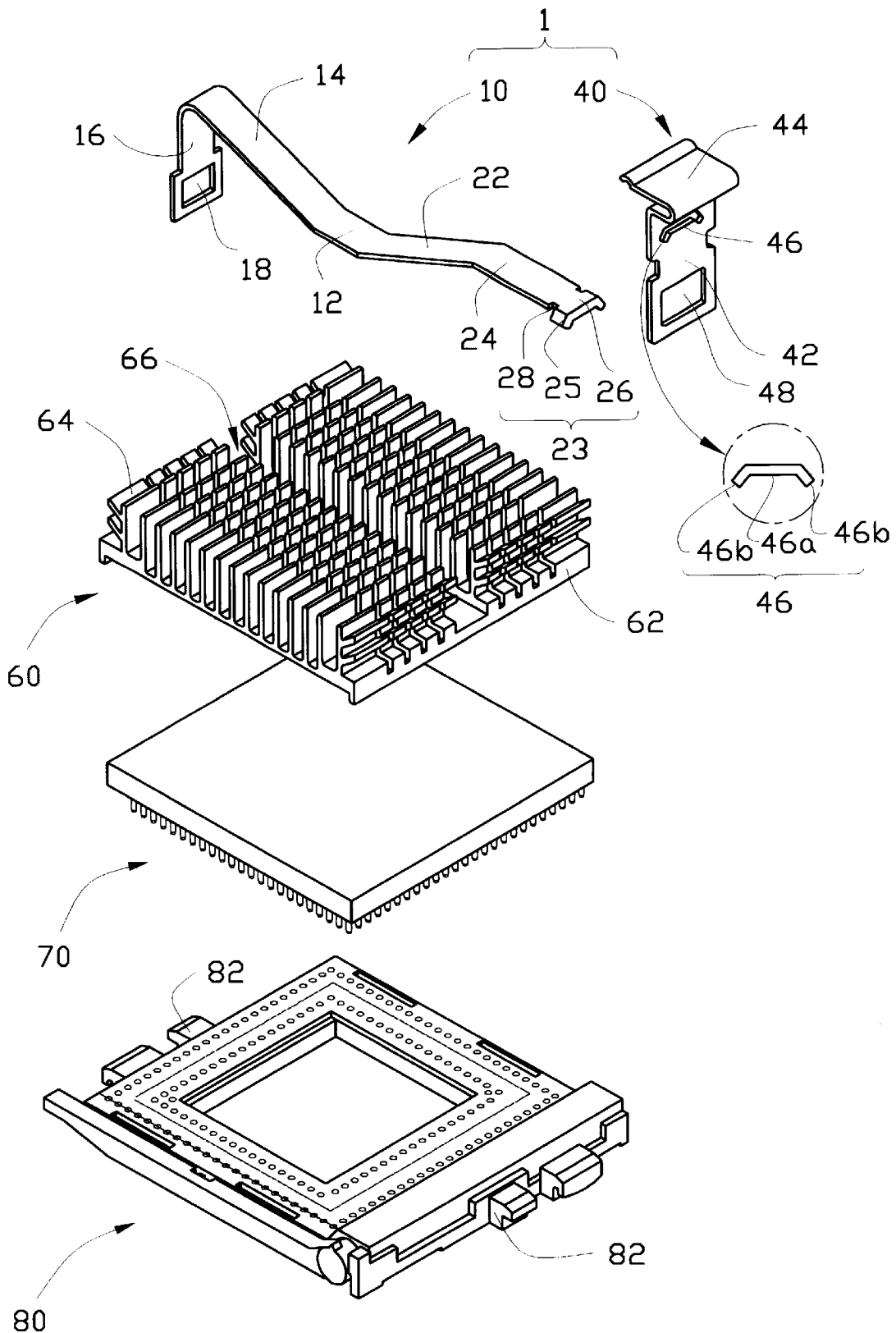
FIG. 1 is an exploded perspective view of a combination of a CPU socket, CPU, heat sink, and clipping device.
Figure 2:
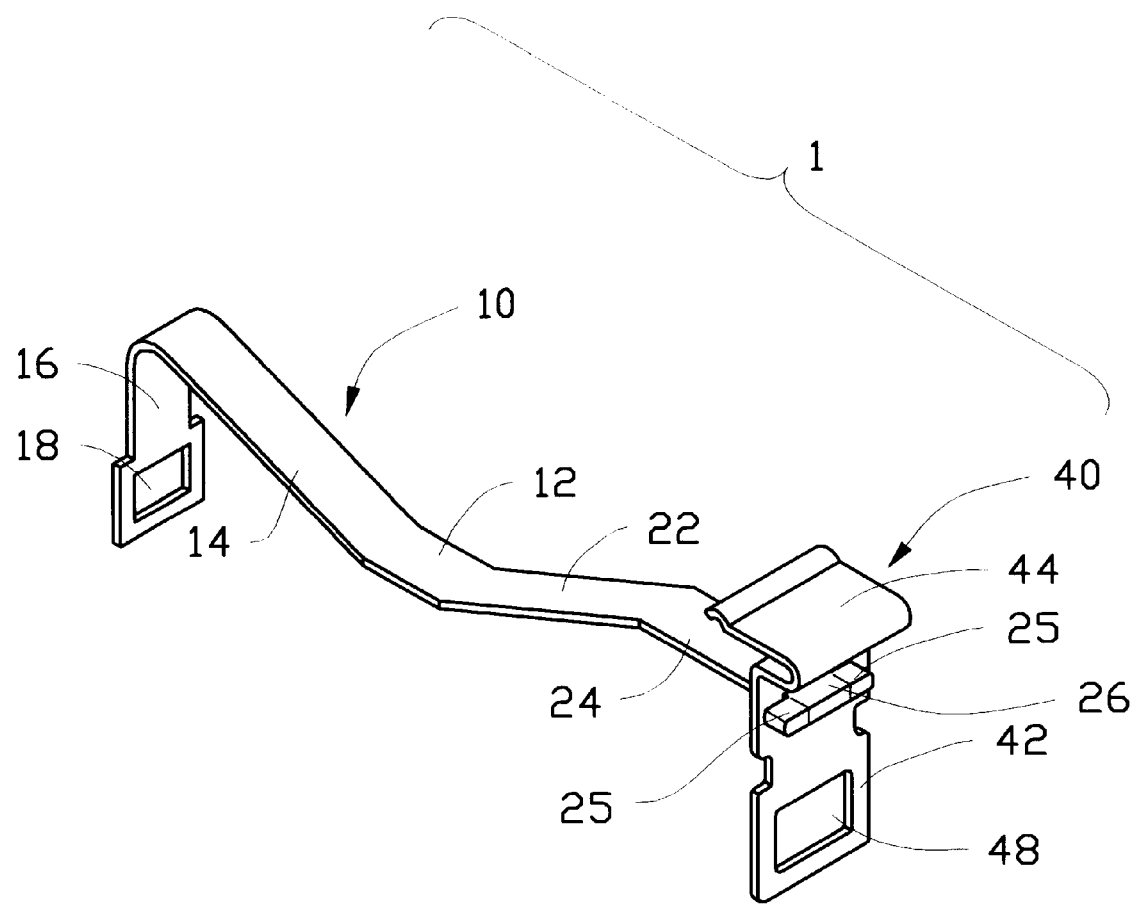
FIG. 2 is a perspective view of the clipping device before permanent deformation of a wing.

Referring to FIGS. 1 and 2, the clipping device 1 in accordance with the present invention generally comprises an elongate biasing strip 10 and a pivotal grasp 40 pivotally engaged with the biasing strip 10. The clipping device 1 is used to attach a heat sink 60 onto a CPU 70 which is mounted on a CPU socket 80.

The heat sink 60 includes a substrate 62 having a plurality of heat dissipating fins 64 extending vertically therefrom and arranged in an array. A trench 66 is formed between the heat dissipating fins 64 for receiving the biasing strip 10 therein. A bottom surface (not labeled) of the substrate 62 contacts with an upper surface (not labeled) of the CPU 70. The CPU 70 is electrically connected with the socket 80 has which is electrically mounted onto a printed circuit board (not shown). The socket 80 a pair of retaining wedges 82 on opposite sides thereof for anchoring the biasing strip 10 and the pivotal grasp 40.

The biasing strip 10 of the clipping device 1 is stamped directly from sheetmetal and includes a base 12. A first extension 14 extends upward and outward from an end of the base 12, and a second extension 22 extends upward and outward from the other end of the base. The first and second extensions 14, 22 are symmetrical to each other. The base 12 contacts the substrate 62 of the heat sink 60 when attaching the later to the CPU 70. The first extension 14 forms an anchoring portion 16 extending toward the socket 80. The anchoring portion 16 forms a recess 18 therein which is suitable for interlocking with the corresponding retaining wedge 82 of the socket 80. A third extension 24 extends horizontally from a free end of the second extension 22. The third extension 24 forms a head portion 23 at a free end thereof The head portion 23 includes a tongue portion 26, a neck portion 28 adjacent to the tongue portion 26, and a pair of wings 25 formed on opposite sides of the tongue portion 26. The wings 25 are offset from the tongue portion 26 such that the head portion 23 has a U-shaped cross section.

The pivotal grasp 40 of the clipping device 1 is also directly stamped from sheetmetal and includes a handle portion 44 and a latch tab 42 extending transversely from the handle portion 44. The handle portion 44 is shaped for receiving a manipulating force thereon. The latch tab 42 includes a slot 46 and a recess 48 in a lower end thereof for interlocking with the corresponding retaining wedge 82 of the socket 80. The slot 46, as seen in the enlarged view of FIG. 1, includes a first portion 46a and second portion 46b offset from the first portion 46a. The first portion 46a is shaped with respect to the tongue 26 and the second portions 46b correspond to the wings 25. By this arrangement, the head portion 23 can be smoothly inserted into the slot 46 without any interference, i.e., this structure has a zero-insertion-force arrangement.

In assembling the pivotal grasp 40 with the biasing strip 10 and the pivotal grasp 40, the head portion 23 is inserted into the recess 46 until the neck portion 28 abuts the latch tab 42. Then the wings 25 are flattened such that the wings 25 are offset or misaligned with the second portions 46b of the slot 46. By this arrangement, the pivotal grasp 42 is permanently and pivotally connected to the biasing strip 10. In light of this, the present invention features a zero insertion force arrangement which is advantageous over the prior art.

Figure 3:
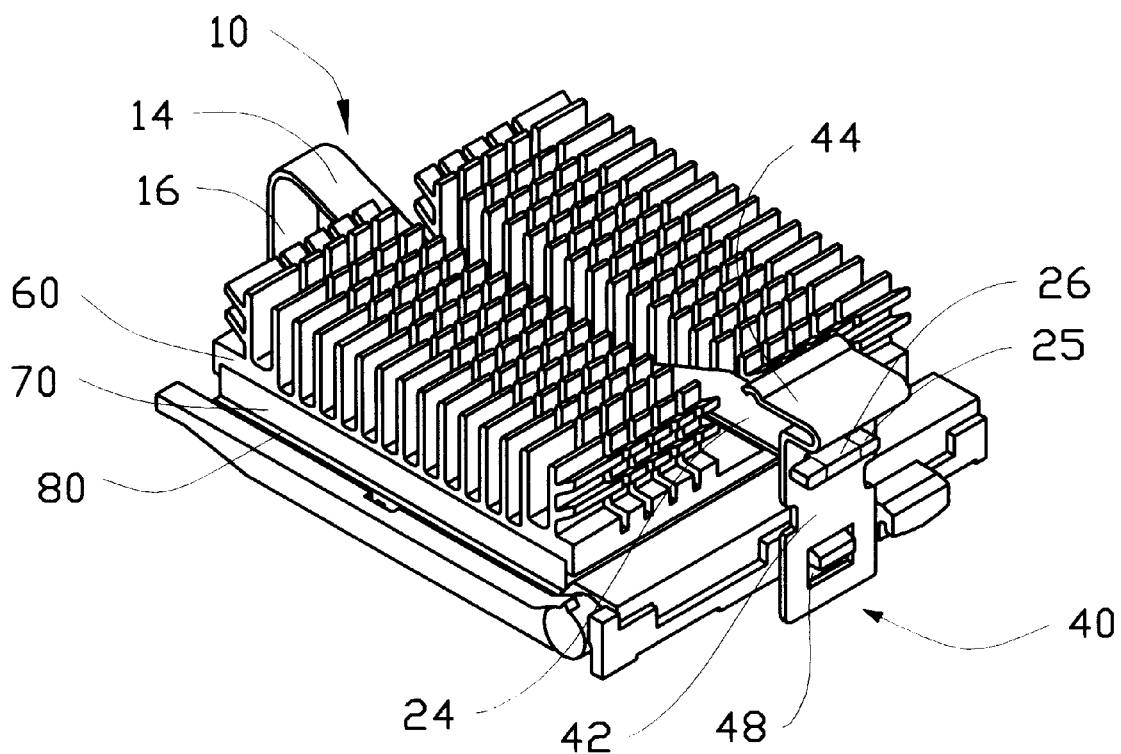
FIG. 3 is an assembled view of FIG. 1.

Referring to FIGS. 1 and 3, when securely attaching the heat sink 62 to the upper surface of the CPU 70, the heat sink 60 is firstly disposed onto the CPU 70. Then the biasing strip 10 is disposed within the trench 66 such that the recess 18 of the anchoring portion 16 engages with the retaining wedge 82 of the socket 80. The biasing strip 10 is designed so that when the base portion 12 abuts the upper surface of the heat sink 60, the retaining recess 48 of the pivotal grasp 40 is above the retaining wedge 82. Then the handle portion 44 of the pivotal grasp 40 is depressed whereby engagement between the retaining recess 48 and the retaining wedge 82 is attained. As the biasing strip 10 is deformed, the heat sink 60 is securely retained on the upper surface of the CPU 70 thereby facilitating heat conduction therebetween.

Since the pivotal grasp 40 is pivotally connected to the biasing strip 10, the pivotal grasp 40 is free to pivot toward or away from the biasing strip 10 when the retaining recess 48 is not engaged with the retaining wedge 82. Accordingly, when the handle portion 44 is depressed such that the retaining recess 48 is disengaged from the retaining wedge 82, the pivotal grasp 40 pivots toward the biasing strip 10 as the neck portion 28 serves as a fulcrum. Thereafter, the biasing strip 10 can be removed from the heat sink 60 and the heat sink 60 can be removed from the CPU 70.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

I Claim:

1. A clipping device for securely attaching a heat sink to a socket for an electrical device, said heat sink including a substrate forming a plurality of heat dissipating fins extending vertically therefrom, an elongate trench formed between said heat dissipating fins, said socket defining a front face for supporting said electrical device thereon, said socket forming a first retaining portion and a second retaining portion opposite said first retaining portion, comprising:

an elongate biasing strip suitable disposed within said trench for attaching said heat sink to said electrical device, said strip forming an anchoring section extending downward from one end thereof and having an engaging portion for interlocking with said first retaining portion of said socket, and a connecting section at the other end;

a pivotal grasp arranged perpendicularly to said biasing strip, defining a thumb portion for receiving an manipulating force thereon and a latch tab, said latch tab having an engaging portion for interlocking with said second retaining portion of said socket; and interconnecting retaining means between said biasing strip and said pivotal grasp to pivotally attach said pivotal grasp to said biasing strip and including a slot on said latch tab and a head portion on said connecting section of said biasing strip, said slot including a first portion and a second portion extending angularly from both ends of said first portion, said head portion including a tongue portion corresponding to said first portion of said slot and a neck portion adjacent thereto for abutting a portion of said latch tab, said tongue portion including a pair of wings extending angularly therefrom corresponding to said to said second portions of said slot, wherein said wings are deformed to mis-align with respect to said second portions of said slot after insertion thereof, thereby securely retaining said head portion within said slot.

* * * * *